United States Patent
Muhammad

(10) Patent No.: US 7,443,324 B1
(45) Date of Patent: Oct. 28, 2008

(54) APPARATUS AND METHOD FOR DITHERING A SIGMA-DELTA MODULATOR

(75) Inventor: Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/807,572

(22) Filed: May 29, 2007

(51) Int. Cl.
*H03M 1/20* (2006.01)
*H03M 3/00* (2006.01)

(52) U.S. Cl. .................. 341/131; 341/143; 341/155

(58) Field of Classification Search .......... 341/131, 341/143, 155
See application file for complete search history.

(56) References Cited

U.S. PATENT DOCUMENTS 6,285,306 B1 * 9/2001 Zrilic ................. 341/143
6,784,817 B2 * 8/2004 Matsuura et al. ......... 341/143

OTHER PUBLICATIONS

Viterbi, A. J., "CDMA—Principles of Spread Spectrum Communication," 1995, pp. 12-19, Addison Wesley Longman, Inc.

Norsworthy, S. R., et al., "Delta-Sigma Data Converters—Theory, Design, and Simulation," 1997, pp. 8-10, 75-140, IEEE.

Staszewski, R. B., et al., "Digitally Controlled Oscillator (DCO)-Based Architecture for RF Frequency Synthesis in a Deep-Submicrometer CMOS Process," IEEE Transactions on Circuits and Systems—II: Analog and Digital Signal Processing, Nov. 2003, pp. 815-828, vol. 50, No. 11, IEEE.

* cited by examiner

*Primary Examiner*—Jean B Jeanglaude
(74) *Attorney, Agent, or Firm*—Ronal O. Neerings; Wade James Brady, III; Frederick J. Telecky, Jr.

(57) ABSTRACT

A signal processor includes a sigma-delta modulator. The input signal to the signal-delta modulator may contain a dc component that generates spurious tones in the modulator output. An input signal to the signal processor is multiplied by an output of a waveform generator to produce an up-converted signal prior to processing by the sigma-delta modulator. Preferably, the waveform generator produces a random signal, which may be a pseudorandom signal. However, other waveforms such as a bipolar binary waveform can also be used. The output of the waveform generator is delayed and multiplied by the output of the sigma-delta modulator to produce a down-converted signal with reduced spurious tones. The delay matches the delay of the sigma-delta modulator. The down-converted signal is filtered with a low-pass filter.

20 Claims, 5 Drawing Sheets

APPARATUS AND METHOD FOR DITHERING A SIGMA-DELTA MODULATOR

TECHNICAL FIELD

This invention relates generally to an apparatus and method for conditioning a signal with a sigma-delta modulator, and more particularly, to an apparatus and method for implementing a sigma-delta modulator with reduced generation of spurious tones in its output.

BACKGROUND

Corresponding to the increased operating frequency and complexity of electronic devices, for example, with the increasing complexity of cellular telephony and high-definition television (HDTV), there is a need for signal converters such as analog-to-digital converters (ADCs) and digital-to-analog converters (DACs) to operate at high sampling rates, provide a high level of conversion resolution, and be free of spurious noise components in an output signal such as spurious tones. Typically, an ADC that is capable of operating at high sampling rates and that provides a high level of conversion resolution includes an over-sampling sigma-delta modulator within its structure to perform the analog-to-digital conversion function.

Circuit structures that include a sigma-delta modulator typically produce spurious tones in the output signal. The origin of these spurious tones is generally due to a feedback process within the sigma-delta modulator interacting with nonlinear or synchronized noise sources within an end product. A second well-known cause described in texts on sigma-delta modulators is "idle tones" that are generated when a constant value (a dc level) is applied at the input of a sigma-delta modulator. Due to feedback in the structure of a sigma-delta modulator, such modulators have infinite impulse response ("IIR") that is susceptible to "limit-cycles" that are also exhibited by IIR filters. These spurious tones generally require a filtering process for their attenuation and often adversely and irreversibly affect the quality of downstream signal processing stages. These tones also determine the spurious free dynamic range (SFDR) of a sigma-delta modulator engine.

Sigma-delta modulators can also be used to reduce the "bit width", i.e., the word size, of band-limited digital signals by over-sampling. For example, by over-sampling a band-limited digital signal at a rate higher than the Nyquist sampling rate by a factor of 16 $(=2^4)$, a reduction of bit width for the digital signal by four bits can be achieved with no loss of signal information content. A one-bit oversampled signal can be produced from a multi-bit signal source to control a highly efficient class-D power amplifier for audio signals.

Sigma-delta modulators can be implemented with analog circuits and comparators, but are often implemented with digital circuitry using digital signal processing techniques. The resulting circuit arrangements can accommodate the design of very compact and highly integrated circuits such as voltage-controlled oscillators and data converters. Analog sigma-delta circuits are used to build sigma-delta analog-to-digital converters that find wide use in many applications such as wireless circuits. A recognized reference that describes the development of sigma-delta modulation theory is the book entitled "Delta-Sigma Data Converters" edited by S. R. Norsworthy, R. Schrier and G. C. Themes, published in 1997 by the IEEE Press ("Norsworthy"). Section 1.2.2.3 in Norsworthy describes the generation of "patterned noise" in the output of sigma-delta modulators in the presence of a dc input. Spurious tones produced at the output of a modulator include the patterned noise generation described in Norsworthy.

The block diagram in FIG. 1 illustrates an exemplary analog modulator 100 of the prior art that produces an output signal $V_{out}$ from an analog input signal $V_{in}$. Alternatively, the analog modulator 100 can be designed to operate with a digital input signal, and can also be designed to produce a digital output signal. The modulator 100 includes a differential amplifier 110 that amplifies the difference between the input signal $V_{in}$ and the output signal $V_{out}$. An integrator 120 that may be arranged as part of the differential amplifier 110 integrates the amplified difference signal, and a comparator 130 swings the output voltage to the upper bias rail voltage of the comparator when the amplified and integrated difference signal is greater than a reference voltage $V_{ref}$, and to the lower bias rail voltage when the amplified and integrated difference signal is less than the voltage $V_{ref}$. In a typical application, the upper and lower bias rails are equal but oppositely poled voltages.

Thus, the output of the sigma-delta modulator is a bipolar binary waveform centered on zero volts (or a pre-selected common-mode voltage at the output). The output voltage $V_{out}$ for an input signal $V_{in}$ is a rectangular voltage waveform that alternates in a seemingly random manner between the upper bias rail voltage and the lower bias rail voltage of the differential amplifier. The frequency of alternation is controlled by the gain A of the differential amplifier. For a constant input voltage $V_{in}$, the average output voltage is equal to the input voltage.

The sigma-delta modulator in FIG. 1 is referred to as a first-order modulator because it includes one integrator. The operation of a feedback loop therein creates a "noise-shaping" operation that shapes the output spectrum of the sigma-delta modulator, pushing the quantization noise from the region around dc to higher frequencies. The output voltage $V_{out}$ is often filtered such as by noise-shaping filter 140, to remove high-frequency noise components before it is coupled to a following processing stage. This filter is generally referred to in the literature as a decimating filter because it reduces the data rate from the over-sampled rate to a lower rate, thereby creating a wider word-length at the lower rate. The limit of the lower rate is the Nyquist rate of the information signal processed or converted by the sigma-delta modulator to produce the output.

Turning now to FIG. 2, illustrated is a block diagram of another digital modulator 200 of the prior art with a digital input word X(n) representing a digital input signal at cycle n, and an output digital word Y(n) at cycle n. The digital sigma-delta modulator 200 is typically operated periodically at a cyclic rate to produce the output sequence Y(n), and can be implemented using digital signal processing techniques. In a typical application, the cyclic rate at which the sigma-delta modulator operates, i.e., the sigma-delta modulator clock frequency, is typically substantially higher than the rate at which a new digital input word X(n) is presented to the input. The ratio of the cyclic rate of the sigma-delta modulator to the rate at which a new digital input word is presented to the input is generally referred to as the "over-sampling rate."

The input signal X(n) and the output of the delay element 240 are subtracted in adder 210, and the cycle-to-cycle result is summed in block 220. ("Adders" include "subtracters" which add digital inputs wherein one input has its sign reversed). Block 220, illustrated with Z-transform notation for a sampled-data system, represents a digital summing process, i.e., block 220 is a digital "integrator" or digital "integration stage." The block 220 typically executes the equation $$L(n+1)=L(n)+U(n),$$

where $U(n)$ and $L(n)$ are, respectively, the input and output of the integrator at cycle n, and $L(n+1)$ is the output of the integrator at cycle n+1. A quantizer 230 reduces the bit width of the output of the sigma-delta modulator to produce the output word $L(n)$, which may be only a single bit. The delay element 240 executes the equation $$W(n)=Y(n-1),$$

where $W(n)$ is the output from the delay element at cycle n, and $Y(n-1)$ is the input to the delay element on the previous cycle. A delay element is digitally implemented by simply storing the input to the delay element and then reading it back one cycle later. The sigma-delta modulator illustrated in FIG. 2 is thus a digital signal processing circuit that produces a sequence of output words $Y(n)$ that assumes values with average value equal to the average value of the input signal $X(n)$.

As described earlier herein, a continuing problem with application of sigma-delta modulators, particularly in applications wherein a dc input signal is converted to an oversampled output signal, has been the generation of spurious tones in the output signal. These spurious tones include the patterned noise described in section 1.2.2.3 of Norsworthy. There are several mechanisms that generate spurious content in the output signal spectrum.

One mechanism for generation of such spurious tones is the basic clock frequency of the modulator, which generates spurious tones typically at one half of the modulator clock frequency. A clock coupled to a sigma-delta modulator typically drives the output at an over-sampling frequency ("fs") and its integer divisions are generally used to produce clocks and phases needed within the sigma-delta modulator/converter, in preceding or following circuits, or elsewhere in an overall system in which the sigma-delta converter is a part. These clocks "bounce" the local ground/supply at their respective rates and cause periodic disturbance in the voltage supply system. Ground bounce is present in circuits inside the sigma-delta converter. Ground bounce can fold shaped noise into the modulator base frequency band, particularly around dc, due to mixing effects that arise for various reasons including circuit nonlinearities.

A further noise-producing mechanism is the generation of idle tones, particularly when the input signal is a dc signal as described in Chapter 3 of the book entitled "Delta-Sigma Data Converters Theory, Design and Simulation" by Norsworthy, et. al., referenced earlier herein. The frequencies of such idle tones are generally proportional to the amplitude of the input signal, which can be slowly varying over time, and are a result of the feedback process of the sigma-delta modulator. Spurious tones in the output signal of a sigma-delta modulator generally have an adverse impact on the application in which it is used, reducing a signal-to-noise ratio or the fidelity of a resulting signal.

An option that has been used in the past to reduce the generation of spurious tones is to dither the modulator input signal. Both static dithering (that applies randomization without consideration of the input signal) and dynamic dithering (that considers the input signal strength) have been proposed. However, dithering increases the noise floor for modulator output signals, and degrades overall modulator performance, particularly for large dc signals. Additionally, proposed dithering schemes have been observed to have limited usefulness in our experience in that they do not provide sufficient randomization for all input signal conditions.

Recognizing that applications of sigma-delta modulators serve large, competitive markets with sensitive performance requirements, a sigma-delta modulator that does not generate spurious tones, particularly for a dc or slowly varying input signal, would provide a competitive advantage. Thus, what is needed in the art is a sigma-delta modulator that can process an analog or digital input signal without generating spurious tones in an analog or digital output signal. Further, a need exists for an improved sigma-delta modulator that can advantageously be produced in an integrated circuit with low cost and with fast signal-processing speed.

SUMMARY OF THE INVENTION

Embodiments of the present invention achieve technical advantages as a signal processor including an input node coupled to an input signal and an output node producing an output signal with reduced spurious tones. The signal processor includes a sigma-delta modulator. In accordance with a preferred embodiment, a structure for the signal processor that dithers the input signal to the sigma-delta modulator with a waveform is introduced. In accordance with a further preferred embodiment, the waveform is a random noise sequence. In a further preferred embodiment, the random noise sequence is a pseudorandom noise sequence produced by a pseudorandom noise generator. In a preferred embodiment, the input signal is converted up in frequency with the waveform by a multiplier before being processed in the sigma-delta modulator, thereby avoiding injecting a dc signal into the input of the sigma delta modulator. In a preferred embodiment, the output of the sigma-delta modulator is converted down (despread) at its output by multiplying with a second multiplier the output signal of the sigma-delta modulator with the same waveform. In a further preferred embodiment, the waveform is delayed with a delay element. In a further preferred embodiment, the delay of the delay element matches a delay of the sigma-delta modulator. In a further preferred embodiment, the output signal is filtered with a low-pass filter. In a further preferred embodiment, an operation of said signal processor is controlled with a controller.

Another exemplary embodiment of the invention provides a method of processing an input signal. In a preferred embodiment the method includes producing a waveform with a waveform generator. In the method, the input signal is multiplied by the waveform to produce an up-converted signal. The method further includes processing the up-converted signal with a sigma-delta modulator to produce a sigma-delta modulator output signal, and multiplying the sigma-delta modulator output signal by the waveform to produce a down-converted signal. In a further embodiment, the method includes filtering the down-converted signal with a low-pass filter. In a further embodiment, the method includes producing the waveform with a noise sequence generator. In a preferred embodiment, the noise sequence generator is a pseudorandom noise generator. In a further preferred embodiment, the waveform generator is a binary waveform generator. In a preferred embodiment, the waveform is delayed by a delay element before it is multiplied with the sigma-delta modulator output signal to produce a down-converted signal. In a further preferred embodiment, the delay of the delay element matches a delay of the sigma-delta modulator. In a preferred embodiment, the method includes controlling the waveform generator and the delay element with a controller. In a further preferred embodiment, the input signal is a digital signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an apparatus and method of constructing a signal processor including a sigma-delta modulator to produce an output signal without significant generation of spurious tones in an output thereof. However, the use and method of this specific context are for illustrative purposes and do not limit the scope of the invention or the appended claims.

Figure 1:
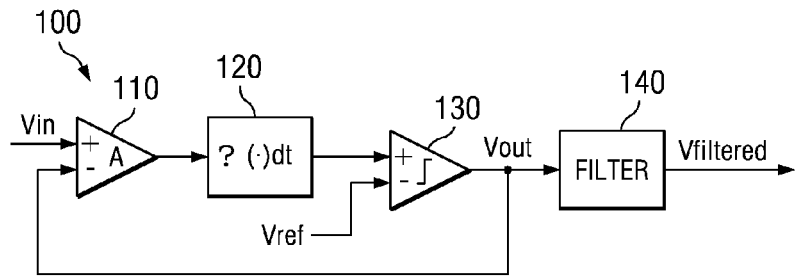
FIG. 1 illustrates a block diagram of a first-order sigma-delta modulator of the prior art.
Figure 2:
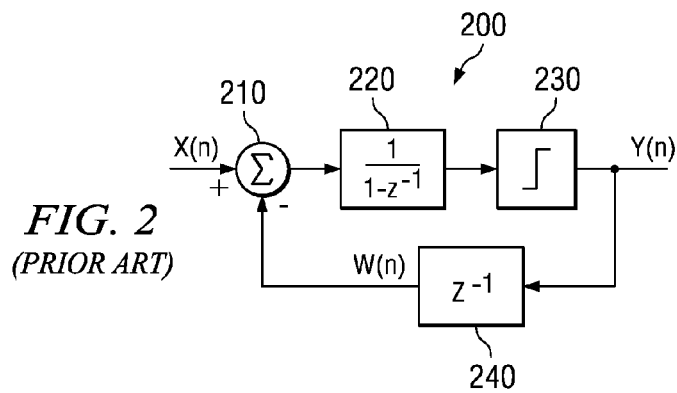
FIG. 2 illustrates a block diagram of a first-order digital sigma-delta modulator of the prior art.
Figure 3:
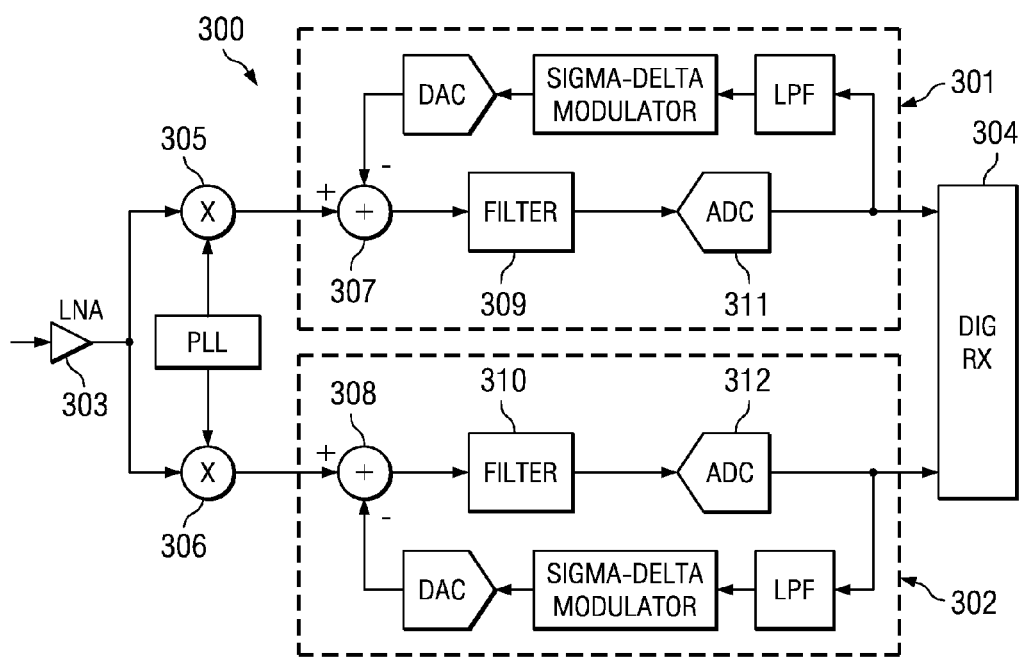
FIG. 3 illustrates a block diagram of direct conversion receiver employing a sigma-delta modulator, constructed in accordance with the principles of the present invention.

FIG. 3 illustrates a use of sigma-delta modulators in an exemplary direct conversion radio receiver 300, providing an application environment for the present invention. A received radio signal is coupled to a low-noise amplifier 303, the output of which is coupled to an in-phase signal processing path 301 and to a quadrature signal-processing path 302, and then to digital receiver 304. The output signal from the low noise amplifier 303 is down-converted to in-phase and quadrature baseband signals by multiplication in mixers 305 and 306 by in-phase and quadrature local oscillator waveforms produced by phase-locked loop PLL. The down-converted outputs of the multipliers 305 and 306 are filtered by analog filters 309 and 310, and are then converted to digital signals by analog-to-digital converters 311 and 312.

The signals produced by analog-to-digital converters 311 and 312 generally contain a small and unpredictable dc or low-frequency component produced by self-mixing of the local oscillators, that is down-converted to baseband by the mixers 305 and 306. Other causes of dc-offset creation in a receive signal processing chain are also documented in the literature such as offsets in amplifiers and/or filters. Other sources of dc offsets in integrated circuits often result, more importantly, from coherent noise, such as ground signal bounce, introduced into signal processing paths by system clocks and by signal-processing components responding to a clock frequency. Such an offset in a direct-conversion receiver appears as a noise source to the demodulation/detection process in the digital baseband, and often needs to be eliminated. To preserve fidelity and reliability of a received signal, it is desirable to remove such unpredictable dc components from the in-phase and quadrature signal processing paths without unnecessary introduction of noise in an added signal component.

The feedback paths illustrated in FIG. 3, each path including a low pass filter LPF, a sigma-delta modulator, and a digital-to-analog converter DAC, are often included to sense such dc components and to remove them in a feedback process, by subtraction using summers 307 and 308. As described previously hereinabove, the use of a sigma-delta modulator to convert a dc signal often results in generation of spurious tones, which would be added to the in-phase and quadrature signals, thereby compromising performance of the receiver. Thus, it is important in such receiver applications to remove such spurious tones from an output signal of a sigma-delta modulator.

Figure 4:
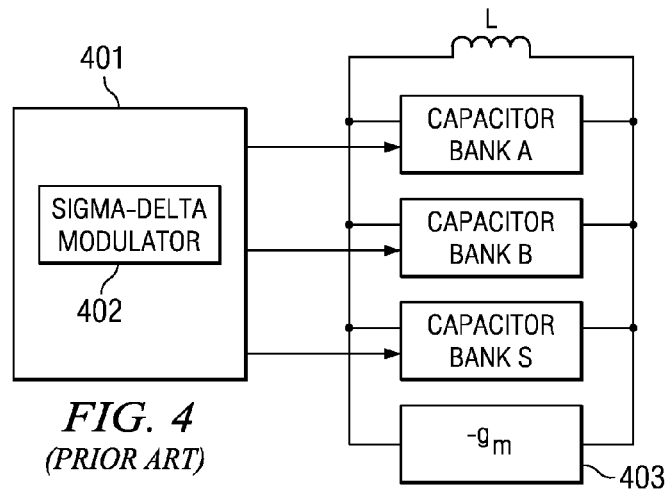
FIG. 4 illustrates an oscillator producing a signal with a frequency controlled by a digital circuit including a sigma-delta modulator, constructed in accordance with the principles of the present invention.

Turning now to FIG. 4, illustrated is another application of a sigma-delta modulator wherein the generation of spurious tones again adversely affects a product performance. The circuit illustrated in FIG. 4 provides a further application environment for the present invention. The circuit represents an oscillator formed by a tank circuit including inductor L coupled in parallel with capacitor banks A, B, and S. The energy source for the oscillator is represented by block 403, which provides a negative conductance $g_m$ for the tank circuit to balance the inherent positive resistance in the circuit, thereby causing the circuit to sustain oscillations. In a practical circuit arrangement, a feedback control path (not shown) is coupled to the negative conductance $-g_m$ to control the amplitude of the oscillator output signal.

The frequency f of the oscillator is determined by the product of inductance and total capacitance coupled in parallel with it, according to the formula:

$$f = \frac{1}{2\pi\sqrt{L \cdot C}},$$

where L and C represent inductance and total capacitance of the tank circuit.

Capacitor bank A, in an exemplary oscillator circuit, is formed with a number M of 1 pF capacitors that can be selectively switched in parallel to produce a desired capacitance value, and are controlled by digital circuit 401. Capacitor bank B is formed with a number N of 0.1 pF capacitors that can be selectively switched in parallel, and are also controlled by digital circuit 401. Capacitor bank S is formed with a number F of 100 fF capacitors that can be selectively switched in parallel and are controlled by sigma-delta modulator 402 included in digital circuit 401. Here M, N, and F are integer numbers suitably selected for the application. In general, the numbers M, N, and F are selected to be powers of two. By selectively switching capacitors in capacitor bank S in parallel with the tank circuit at the clock frequency of the sigma-delta modulator, fractional capacitors can be effectively added in parallel with the larger capacitors selectively switched in capacitor banks A and B. Again, spurious tones included in an output signal of the sigma-delta modulator affect selection of capacitors in capacitor bank S, which contribute signal components in the spectrum of the substantially sinusoidal waveform produced by the oscillator, adversely affecting an application in which it is used. R. B. Staszewski, et al., in the paper entitled "Digitally Controlled Oscillator (DCO)-Based Architecture for RF Frequency Synthesis in a Deep-Submicrometer CMOS Process," published in IEEE Transactions on Circuits and Systems, Vol. 50, Issue 11, pp. 815-828, November 2003, provides exemplary details of such an oscillator.

Figure 5:
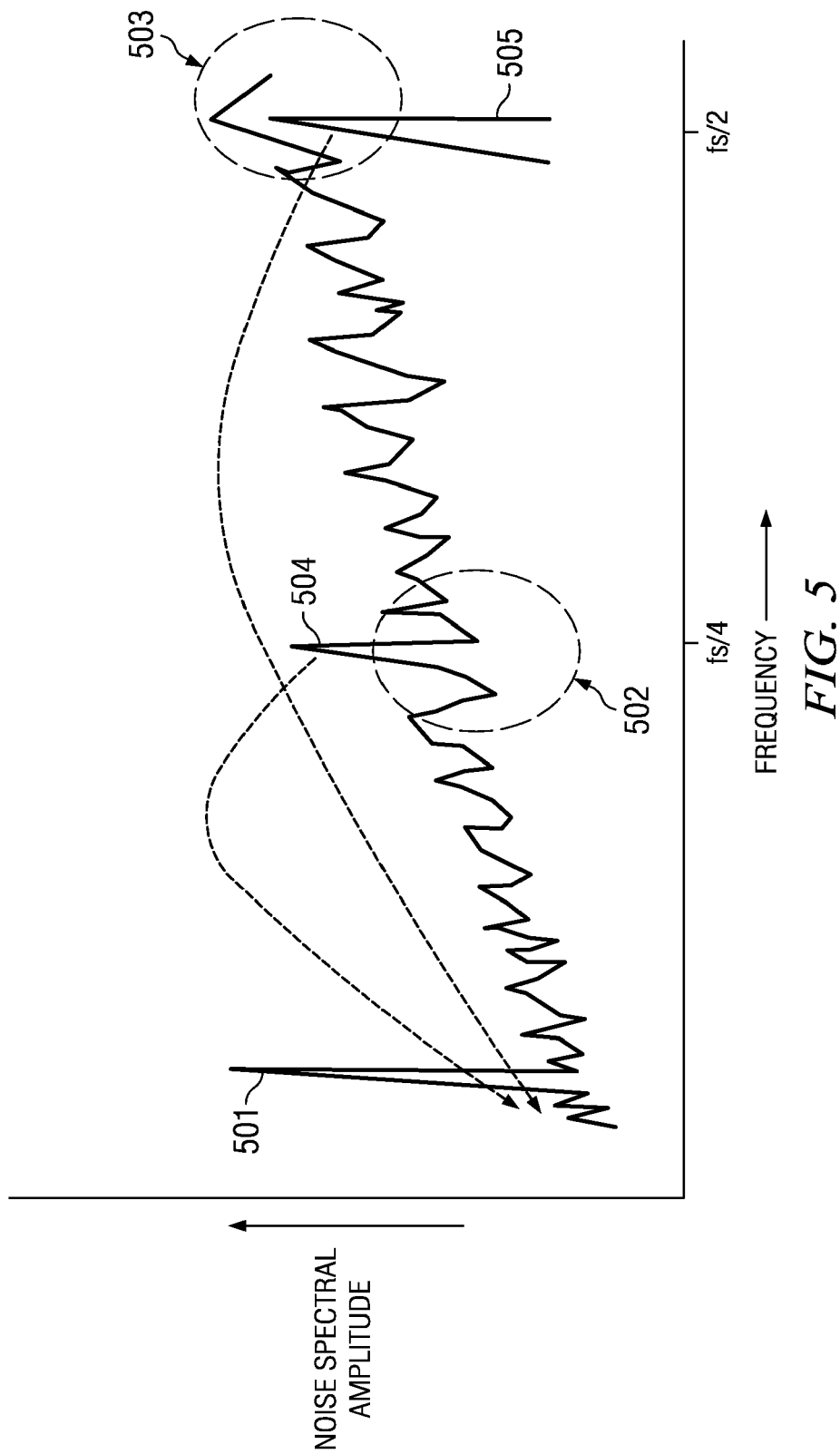
FIG. 5 illustrates a typical noise spectral amplitude graph representing the output noise spectrum of a sigma-delta modulator.

Turning now to FIG. 5, illustrated is a representative noise spectral density graph plotting the output noise spectrum of a sigma-delta modulator on the vertical axis versus frequency on the horizontal axis. Graphs such as that illustrated in FIG. 5 may be constructed on log-log axes, or only the y-axis may be constructed with a logarithmic scale. The noise spectral peak illustrated at 501 represents the frequency of a test sinusoidal waveform coupled to the sigma-delta modulator input.

There are several mechanisms by which spurious tones/noise can be produced close to dc in the in-band frequencies, thereby degrading performance of a sigma-delta modulator by reducing the available dynamic range in a band of interest. Since a clock is provided at frequency fs (the sampling rate of the sigma-delta ADC), generally integer divisions of the clock frequency are also present in the bias voltage supply system of the ADC. Spurious tones 502 and 503 illustrate the presence of supply bounce energy at frequencies fs/4 and fs/2. The energy at frequency fs/2 is lower than the energy of the shaped-noise at the output of the sigma-delta modulator at that frequency, and is hidden under the spectrum. Due to nonlinearities present in the overall system, the noise spectrum at these frequencies can be folded, aliased, and mixed down (down converted) in frequency in accordance with the power of these tones. Hence, peak 504 indicates that the ground/supply bounce energy at fs/4, due to a clock in the system toggling at fs/4, will mix with the energy at the output of the modulator at the same frequency, shown encircled in 502, thereby mixing that energy down to in-band frequencies (i.e., close to dc).

Similarly, the ground/supply bounce due to a clock at fs/2, shown in the figure as the tone 505, can mix down energy at the output of the modulator, shown encircled in 503, to in-band frequencies. Tones 504 and 505 are exaggerated in the figure to illustrate this point, as these are the energy of ground/supply bounce at the supply/ground of the sigma-delta modulator and are caused by a sudden rush of current at the respective frequencies in the power system when the respective clocks swing rail-to-rail. This disturbance of the power supply to the sigma-delta modulator is generally kept small by proper design of the power management system that uses good decoupling capacitors at appropriate nodes that need to be protected. Nonetheless, the mechanism by which these clock frequencies can degrade the in-band performance of the sigma-delta modulator is clearly illustrated.

Embodiments of the present invention as described hereinbelow do not remove supply bounce energy such as illustrated by spectral peaks 504 and 505. However, noise spectral peaks in the output spectrum generated by the sigma-delta modulator can be substantially attenuated by filtering the sigma-delta modulator output. This would ensure that these frequency-folding mechanisms do not degrade in-band performance beyond what a smooth spectrum would degrade. This can be recognized by considering that if noise spectral peaks 502 or 503 had a spurious tone or a collection of tones higher than the smooth spectral floor shown at 502 and 503, the bounce illustrated at 504 and 505 would fold to in-band frequencies, thereby severely degrading in-band performance and reducing the dynamic range provided in these frequencies.

Figure 6:
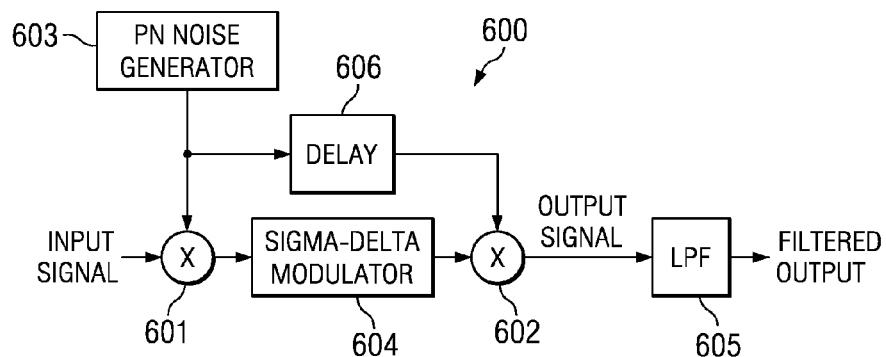
FIG. 6 illustrates a sigma-delta modulator coupled to a pseudorandom noise generator to spread its input signal and despread its output signal, constructed in accordance with the principles of the present invention.

FIG. 6 illustrates a signal processor including a sigma-delta modulator with its input and output signals spread and despread, respectively, using a waveform generator 603, constructed according to the principles of the present invention. In an exemplary embodiment, waveform generator 603 is a pseudorandom noise ("PN") generator. The frequency-spreading operation modulates the sigma-delta modulator input signal with a random signal component, which appears in its output after an inherent modulator delay, which may be zero delay. The spreading operation is performed by multiplying the input signal in multiplier 601 by a pseudorandom noise spreading sequence. The pseudorandom noise spreading sequence includes a random binary periodic sequence, such as the result of a finite coin-flipping sequence, with bipolar polarity producing, for example, a bipolar signal with amplitudes of +1 volt and −1 volt, or in another example, with logic values 1 and 0 respectively. The result of the signal multiplication in multiplier 601 by the pseudorandom noise spreading sequence is to produce an uncorrelated input data sequence for sigma-delta modulator 604. The multiplier 601 can be interpreted to be n XOR gates in parallel for n-bit multiplication (without carry), a full binary multiplier, or a mixer. For an analog circuit, multiplier 601 represents a mixer or an analog multiplier.

A random binary output sequence from a pseudorandom noise generator produces two output values with equal probability, and independently, from cycle to cycle. The random binary sequence produced by such a process will have an equal number of "agreements" and "disagreements" if the sequence is shifted by any nonzero number of steps within its period of repetition. Practical arrangements to produce such pseudorandom noise sequences include various random number generators known in the art (which do not produce periodic sequences), and a table listing a sufficiently long prestored sequence of random numbers.

A commonly used alternative to producing pseudorandom noise sequences is a linear binary sequence generator constructed with delay operators, modulo-2 adders, and a "characteristic polynomial" describing a feedback operation therein that produces a maximum length shift-register sequence. The general design of such linear binary sequence generators is well known in the art, such as described by A. Viterbi in the book entitled "CDMA—Principles of Spread Spectrum Communication," Addison Wesley Longman, 1995, pp. 12-19, which is hereby referenced and incorporated herein.

While the input signal is spread at the output of multiplier 601, the dc input is effectively eliminated at its input. Hence, no limit-cycle should be produced since the dc signal is effectively eliminated at the modulator input. An output of sigma-delta modulator is despread with an appropriately delayed replica of the spreading sequence provided by the PN sequence generator 603. Delay of the spreading sequence is provided by delay element 606. Despreading reconstructs the input signal while everything else is spread. A small reduction in the dynamic range is incurred due to the reduction of the effective over-sampling ratio, and is directly related to the spreading factor. This can be compensated for by increasing the order of the sigma-delta modulator and by keeping the spreading factor low.

Multiplier 602 processes a single-bit or multi-bit output of sigma-delta modulator 604, and can be implemented using an XOR operation using digital gates that mix the output with an appropriately delayed spreading sequence. The spreading factor preferably is kept small, and, in a preferred embodiment, should be a periodic sequence.

Figure 7:
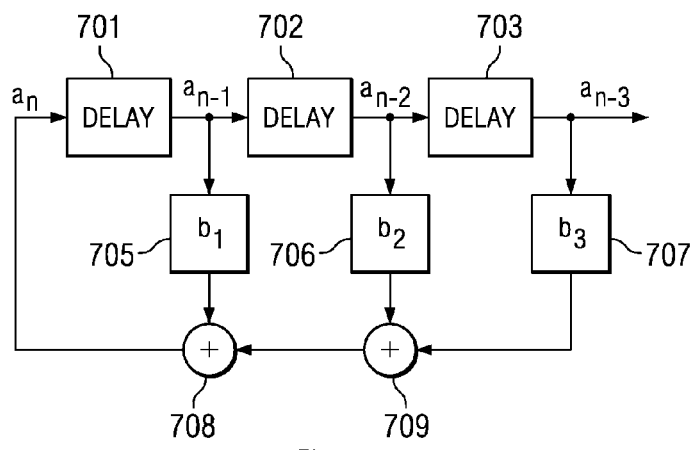
FIG. 7 illustrates an exemplary pseudorandom noise generator.

Turning now to FIG. 7, illustrated is an exemplary pseudorandom noise generator, such as the pseudorandom noise generator 603 illustrated in FIG. 6, constructed with a binary digital feedback circuit including delay elements 701, 702, and 703, gain blocks 705, 706, and 707, and exclusive-or summers 708 and 709. Delay elements 701, 702 and 703 delay a binary input signal $a_n$ to produce delayed signals $a_{n-1}$, $a_{n-2}$, and $a_{n-3}$ at each clock cycle from a clock signal input, not shown. The delayed signals $a_{n-1}$, $a_{n-2}$, and $a_{n-3}$ are coupled to the exclusive-or summers 708 and 709 through the gain blocks 705, 706, and 707, which provide binary gains of zero or one, which are typically constant gains. The coefficients $b_1$, $b_2$, and $b_3$ in the gain blocks define the characteristic polynomial for the pseudorandom noise generator. Thus, an output sequence of signals $a_{n-3}$ is produced at each clock cycle, depending on the previous states of the delay elements and the coefficients of the characteristic polynomial.

A pseudorandom noise generator constructed as illustrated in FIG. 7 can produce a "maximum length" pseudorandom noise sequence (thus, with a finite period) if the characteristic polynomial is an "irreducible polynomial," i.e., it is not factorable. A maximum length noise sequence is a noise sequence of length $2^r-1$, where r is the order of the characteristic polynomial, i.e., 3 for the example illustrated in FIG. 7. For example, an irreducible characteristic polynomial of order 3 is 1,1,1, and one of order 4 is 1,1,0,1. Irreducible characteristic polynomials of arbitrary order can be readily generated for such feedback generators, producing arbitrarily long but finite pseudorandom noise sequences. Irreducible polynomials are well known in the mathematical arts and will not be further described here, in the interest of brevity. The pseudorandom noise generator illustrated in FIG. 7 can be readily extended to produce arbitrarily long pseudorandom noise sequences by increasing its order by the addition of further delay elements, gains, and exclusive-or adders.

Turning again to FIG. 6, the output of sigma-delta modulator 604 is again multiplied by the same pseudorandom number sequence after a delay that preferably substantially matches the signal processing delay of the sigma-delta modulator. Since the noise content of the output of sigma-delta modulator 604 is directly correlated with the pseudorandom number sequence, a correlated output signal from multiplier 602 is produced. Spurious noise tones produced by the sigma-delta modulator (as well as produced externally to it) will be uncorrelated with the pseudorandom number sequence, resulting in an insubstantial output signal from multiplier 602 at any particular frequency. Correlated noise sources contained in the output of the sigma-delta modulator will be spread by the despreading operation performed by multiplier 602, thereby reducing their amplitude at any particular frequency, and spreading their energy over the entire bandwidth of the modulator. The output signal from multiplier 602 may be filtered as necessary with low pass filter 605 to produce a filtered output signal.

A sigma-delta modulator is constructed with a feedback signal, and therefore produces an output signal characterized by an "infinite impulse response" because its output generally continues indefinitely for an input signal of finite duration. The impulse response of a sigma-delta modulator can be observed by applying a unit "delta function" as a test signal at the input for an analog-input modulator or a single unit datum as a test signal at the input for a digital-input modulator, and observing the resulting output data sequence. A modulator delay can be determined by taking the average delayed value of the output data sequence with respect to the input test signal. As a result of feedback, such a loop continues to produce output even when the input is removed due to so-called "limit-cycles." In the presence of a dc input signal, spurious tones whose frequency depends on the absolute value of the applied dc signal, which is described in Norsworthy, in Chapter 3, are produced.

Figure 8:
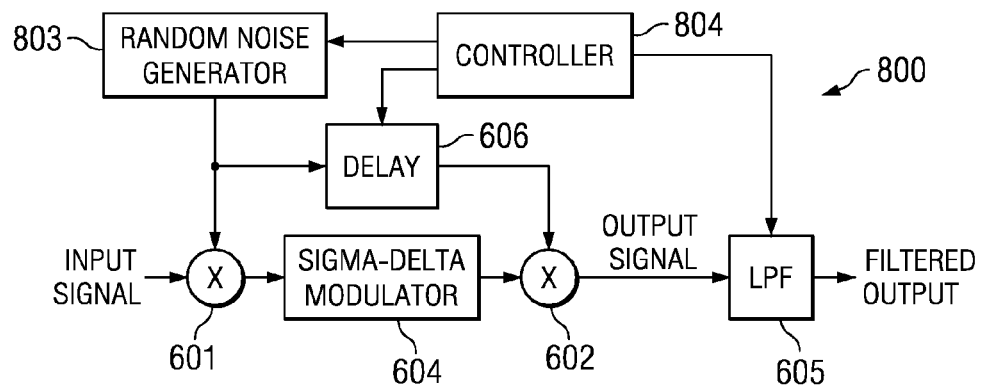
FIG. 8 illustrates a sigma-delta modulator coupled to a random noise generator to spread an input signal and despread an output signal, including a controller to control the random noise generator, a delay block, and a low-pass filter, constructed in accordance with the principles of the present invention.

Turning now to FIG. 8, illustrated is a signal processor, constructed according to the principles of the present invention, including a sigma-delta modulator with input and output signals spread and despread with a periodic random noise sequence. In this illustration, the pseudorandom noise generator 603 described hereinabove with reference to FIG. 6 is replaced with random noise generator 803, such as one operating with a stationary stochastic process. Various technologies can be used to construct a random noise generator. One approach measures with an analog circuit the wideband Johnson noise inherently formed across a resistor at ordinary temperatures. Such noise can be amplified, sampled, and coupled to a comparator to produce a random binary sequence. Alternatively, various digital approaches known in the art to produce a random noise sequence which start with a random number seed and compute a random number sequence with an arbitrarily long period of repetition, can be used.

FIG. 8 also shows a controller 804 that controls the spreading/despreading noise generator, the delay element, and the low-pass filter that follows this arrangement. The controller may be implemented using a state-machine, a microprocessor, or a digital signal processor, using techniques well known in the art. The controller can start and stop the spreading/despreading operation, and can optionally override the spreading/despreading operation by controlling 803 (or 603) to produce all ones. The controller can also reset or control the functions inside the LPF, block 605. The controller may have inputs that allow it to make decisions on when to activate or deactivate the spreading/despreading operation provided in an embodiment of the invention. If the input to the sigma-delta modulator does not contain a dc signal component, it may determine that better performance is obtained by deactivating the random noise generating process 803 (or 603) to produce all "ones."

Figure 9:
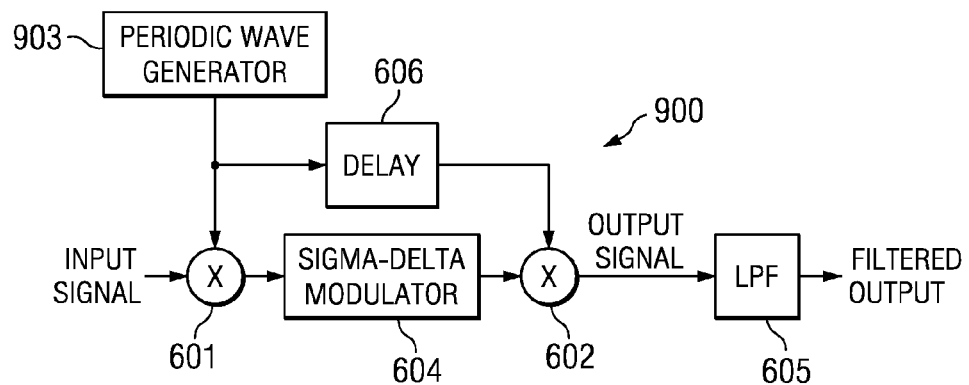
FIG. 9 illustrates a sigma-delta modulator coupled to a periodic wave generator to mix up the dc input signal at the input of the modulator and mix down the output of the sigma-delta modulator, constructed in accordance with the principles of the present invention.

FIG. 9 shows a further embodiment in which a noise generator as described previously hereinabove is replaced by wave generator 903. In a preferred embodiment, wave generator 903 produces a square-wave signal that converts the dc input signal into a square wave at the output of multiplier 601 scaled by the dc input value. Preferably, the square wave is a bipolar square wave with equal but oppositely poled amplitudes. If the wave generator generates a sinusoidal wave, the output of multiplier 601 would be a sinusoidal wave scaled by the input dc value. Applying a time varying input signal to the sigma-delta modulator eliminates generation of idle tones, and produces a noise-shaped, over-sampled output that does not compromise an effective over-sampling ratio. The output of the modulator is now mixed down in frequency using an appropriately delayed version of the output of periodic wave generator 903. If periodic wave generator 903 produces a square-wave signal, it is relatively easy to perform the mixing operation in multiplier 602. Digital gates performing XOR operation can mix down a single- or multi-bit output of the modulator. A mixer or a full multiplier may be needed if the output of the modulator is an analog or a digital signal, respectively. A low pass filter follows the output of the modulator and removes shaped noise at higher frequencies.

These circuits can operate under control of a controller that determines when and when not to spread an input signal. The controller may determine to use all "ones" at the second (spreading) inputs to multipliers 601 and 602, thereby bypassing the presented method, using spreading for certain inputs and a periodic wave such as a square or sinusoidal wave for some other signal types.

Figure 10:
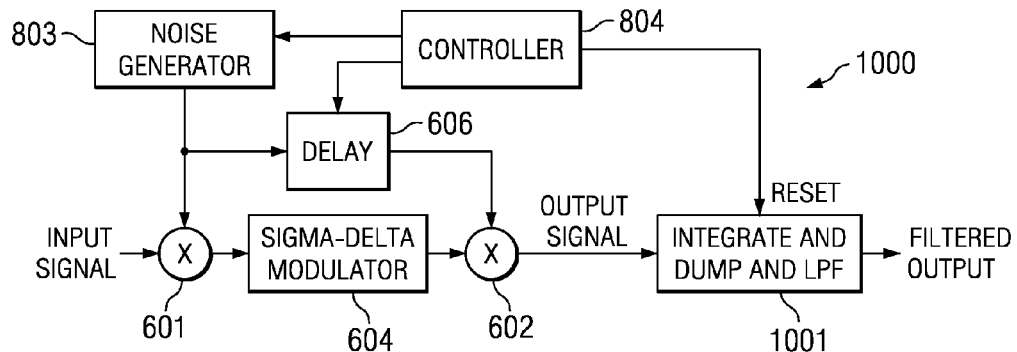
FIG. 10 illustrates a sigma-delta modulator coupled to a noise source and controlled by a controller, the output of the sigma-delta modulator processed by an integrate-and-dump operation before low-pass filtering.

Turning now to FIG. 10, illustrated is an embodiment in which the output is passed through integrate-and-dump operation prior to low-pass filtering. This case would be most relevant when a spreading sequence such as PN sequence or a general noise source is used in noise generator 803. At the second input of multiplier 601, a periodic noise signal is presented that causes the input signal to spread at the output of multiplier 601 by a spreading factor equal to the period of the noise source. Let Q denote the period of the noise source, which is also the spreading factor. A periodic noise output can be formed successively generating the same Q outputs from the noise generator, such as by storing them in a look-up table. Other methods of generating and storing Q successive random outputs are also possible.

After passing through the sigma-delta modulator, the output is despread using the same spreading sequence by inserting an appropriate delay followed by an integrate-and-dump operation in which the output is integrated for Q successive values. The integrator is reset before starting the next integration cycle. The output of the integrate-and-dump operation is provided to the following low-pass filter. Under the control program executed by controller 804, the timing and delays of the operation are controlled to provide the correct despreading and filtering operation. The controller may by-pass this operation or replace it with one of the earlier described arrangements in which only the integration operation is bypassed.

In some applications, no low-pass filtering is used at the despread output. In other applications, only the integrate-and-dump output is used without explicit low-pass filtering to further process the output.

Figure 11:
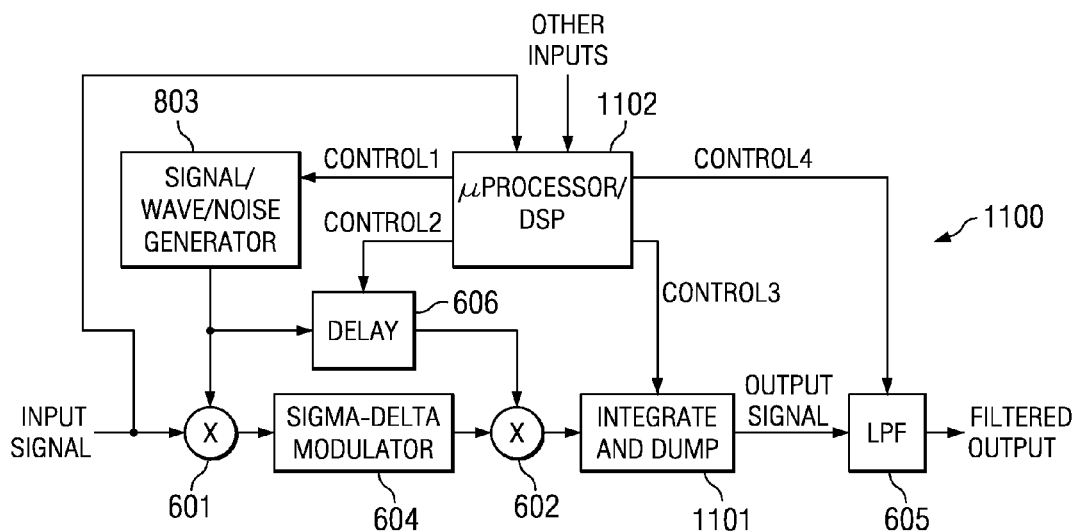
FIG. 11 illustrates a generalized signal processor including a sigma-delt modulator.

Turning now to FIG. 11, illustrated is a generalized signal processor including a sigma-delta modulator, constructed according to the principles of the present invention. A controller 1102 provides control signals to various signal-processor elements to determine how an input signal should be processed. A controller can determine the most appropriate way to operate an ADC, a DAC, or a digital-to-digital converter, depending on the needs of an application. The controller may have other possible inputs, such as a signal indicating an operating voltage, a temperature, or another metric which can affect a quality of an output signal produced by the sigma-delta modulator. The controller determines a best course of action for the signal processor, for example, whether or not to activate a spreading/despreading operation, whether or not to use an integrate-and-dump operation, or whether or not to use a periodic wave for up-mixing (converted up) in frequency the input before processing by the sigma-delta modulator and down-mixing the output after processing by the sigma-delta modulator. The delay block can be dynamically controlled to ensure correct signal processing operation, including switching between operating modes.

In a typical signal-processing application, without limitation, the bandwidth of the input signal will preferably be substantially less than the frequency of generating random bits by the random or pseudorandom noise generator, which in turn will preferably be substantially less than the clock frequency of the sigma-delta modulator.

Such spreading and despreading of input and output sigma-delta modulator signals to remove spurious tones, constructed according to the principles of the present invention, may be performed for signal processing arrangements with digital or analog inputs, and for digital or analog outputs, as an application requires.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing efficient implementation of a sigma-delta modulator with an input signal spread with a pseudorandom noise generator as described herein may be varied while remaining within the broad scope of the present invention. In a further embodiment, an alternative device to generate a random noise sequence may be employed within the broad scope of the present convention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A signal processor, comprising:
    an input node for receiving an input signal, and an output node producing an output signal;
    a waveform generator;
    a first multiplier including a first input coupled to said input node and a second input coupled to said waveform generator;
    a sigma-delta modulator with an input coupled to an output of said first multiplier; and
    a second multiplier including a first input coupled to an output of said sigma-delta modulator and an output coupled to said output node, and said waveform generator coupled to a second input of said second multiplier.

2. The signal processor according to claim 1, wherein said waveform generator generates a noise sequence.

3. The signal processor according to claim 1, wherein said waveform generator comprises a pseudorandom noise generator.

4. The signal processor according to claim 1, wherein said waveform generator comprises a binary waveform generator.

5. The signal processor according to claim 1, wherein said waveform generator is coupled to said second input of said second multiplier through a delay element.

6. The signal processor according to claim 4, wherein a delay of said delay element matches a delay of said sigma-delta modulator.

7. The signal processor according to claim 1, wherein said input signal comprises a digital input signal.

8. The signal processor according to claim 1, wherein said output signal comprises a digital output signal.

9. The signal processor according to claim 1, further comprising a low-pass filter coupled between said output of said second multiplier and said output node.

10. The signal processor according to claim 9, wherein said low-pass filter comprises an infinite impulse response filter.

11. The signal processor according to claim 1, further including a controller coupled to said waveform generator that controls an operation of said signal processor.

12. A method of processing an input signal, the method comprising:
  producing a waveform;
  multiplying said input signal by said waveform to produce an up-converted signal;
  processing said up-converted signal with a sigma-delta modulator to produce a sigma-delta modulator output signal; and
  multiplying said sigma-delta modulator output signal by said waveform to produce a down-converted signal.

13. The method as claimed in claim 12, further including filtering said down-converted signal.

14. The method as claimed in claim 12, wherein producing said waveform comprises producing said waveform with a noise sequence generator.

15. The method as claimed in claim 14, wherein said noise sequence generator comprises a pseudorandom noise generator.

16. The method as claimed in claim 12, wherein producing a waveform comprises producing a binary waveform.

17. The method as claimed in claim 12, further comprising delaying said waveform before multiplying said sigma-delta modulator output signal by said waveform.

18. The method as claimed in claim 17, wherein delaying said waveform comprises delaying said waveform by a delay of said sigma-delta modulator.

19. The method as claimed in claim 17, further including controlling said waveform generator and said delay element with a controller.

20. The method as claimed in claim 12, wherein said input signal comprises a digital signal.

* * * * *